United States Patent [19]

Yamauchi

[11] 4,365,209
[45] Dec. 21, 1982

[54] IMPEDANCE TRANSDUCER

[75] Inventor: Satoshi Yamauchi, Yokohama, Japan

[73] Assignee: Ricoh Co., Ltd., Tokyo, Japan

[21] Appl. No.: 131,875

[22] Filed: Mar. 19, 1980

[30] Foreign Application Priority Data

Mar. 23, 1979 [JP] Japan .................................. 54-34093
Mar. 23, 1979 [JP] Japan .................................. 54-34094

[51] Int. Cl.³ ............................................. H03F 3/08
[52] U.S. Cl. .................................. 330/308; 330/110; 330/288
[58] Field of Search ............... 330/289, 293, 288, 308, 330/88, 59

[56] References Cited

U.S. PATENT DOCUMENTS 3,736,520 5/1973 Acker ................................. 330/110
4,158,178 6/1979 Schade ................................. 330/288

OTHER PUBLICATIONS

B. Oischewski, Electronics, "Optical Coupling Extends Isolation Amplifier Utility" McGraw Hill Inc., vol. 49, No. 17, pp. 81-88, Aug. 19, 1976.

Primary Examiner—Michael J. Tokar
Attorney, Agent, or Firm—Burgess, Ryan and Wayne

[57] ABSTRACT

An impedance transducer is shown wherein two active elements of the same characteristics are formed on one thermally conductive base, one of these active elements is connected in a negative feedback circuit of a negative feedback amplifier, and the internal impedance of the other of these active elements is proportional to the input of the negative feedback amplifier.

11 Claims, 32 Drawing Figures

HIGH SOUND SIDE

LOW SOUND SIDE

THE RANGE OF ADJUSTMENT

IMPEDANCE TRANSDUCER

BACKGROUND OF THE INVENTION

The present invention relates to an impedance transducer for obtaining impedance proportional to the input.

Conventionally, a variable resistor is known as a mechanical impedance transducer. However, such transducers are defective in that noise tends to be generated when the slider is moved. Further, resistance may be changed by a switch which is controlled by information stored in a digital memory. However, such a device is complex in construction, and the resistance must be varied in a stepped form. This device also requires an auxiliary device for fine adjustment of the resistance.

SUMMARY OF THE INVENTION

One of the objects of the present invention is to provide an impedance transducer which varies impedance according to the input signal without generating undesirable noise.

Another object of the present invention is to provide an impedance transducer wherein the internal impedance is not affected by the current flowing through the active elements at the output side.

The impedance transducer of the present invention is so constructed that two active elements having the same characteristics are formed on a thermally conductive base, one of these active elements constitutes part of the negative feedback factor of a negative feedback amplifier, and the internal impedance of the other active element is proportional to the input of said negative feedback amplifier.

DESCRIPTION OF THE PREFERRED EMBODIMENTS

Figure 1:
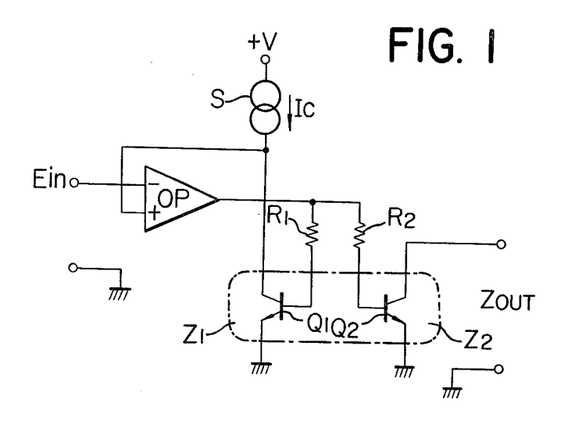
FIG. 1 is a circuit diagram of an impedance transducer having transistors according to a first embodiment of the present invention.

In FIG. 1 is shown the basic circuit of an impedance transducer in accordance with the first embodiment of the present invention. An operational amplifier OP has a high input impedance, for either direct current or alternating current, and does not have an input offset voltage. Active elements $Q_1$ and $Q_2$ are formed on the same pellet and have substantially the same characteristics. These elements are transistors having, in particular, the same current amplifying ratio $\beta$. An input voltage is directly applied to the inverting input of the operational amplifier $OP_1$ and its output is connected through the resistor $R_1$ to the base of the transistor $Q_1$, and through the resistor $R_2$ to the base of the transistor $Q_2$. The emitters of the transistors $Q_1$ and $Q_2$ are both grounded. The collector of the transistor $Q_1$ is connected to a constant current source S as well as to the non-inverting input of the operational amplifier $OP_1$. The operational amplifier $OP_1$, the transistor $Q_1$, and the resistor $R_1$ constitute a negative feedback amplifier. (The resistor $R_1$ may be eliminated, in which case the resistor $R_2$ is also eliminated.) When a voltage $E_{in}$ is applied to the inverting input of the operational amplifier $OP_1$, the output current of the operational amplifier $OP_1$ flows through the base of the transistor $Q_1$, and the potential at the collector is equalized with the input voltage $E_{in}$. If the internal impedance between the collector and the emitter of the transistor $Q_1$ is $Z_1$, the following equation may be satisfied:

$$Z_1 = E_{in}/I_c \tag{1}$$

where the operation range of $E_{in}$ is $0 \leq E_{in} \leq (+)V_c$ and $I_c$ is the current flowing from the constant current source S.

The internal impedance $Z_1$ of the transistor $Q_1$ is the impedance of the closed loop of the negative feedback amplifier incorporating the operational amplifier $OP_1$ and the transistor $Q_1$. Thus, it is impossible to isolate this as a pure impedance so as to utilize it. However, the base current of the transistor $Q_1$ is the same as that flowing through the transistor $Q_2$ which is formed on the same pellet and has substantially the same characteristics as the transistor $Q_1$. It is thus possible to isolate the internal impedance $Z_2$ of the transistor $Q_2$, which is equal in value to the internal impedance $Z_1$ of the transistor $Q_1$. Since the transistors $Q_1$ and $Q_2$ have the same current amplifying ratio $\beta$ which is the transmission characteristic of the input and the output, the base currents between their collectors and emitters are also equal when an equal current is made to flow through the transistors $Q_1$ and $Q_2$. Since the transistors $Q_1$ and $Q_2$ are disposed on the same pellet, they receive the same amount of heat from the outside. The heat generated in one of the transistors is immediately transmitted to the other, thus raising the temperature of the other transistor and varying the current amplifying ratio $\beta$ in the same manner. As a result, the following relation is given:

$$Z_{out} = Z_1 = Z_2 = E_{in}/I_c \qquad (2)$$

Figure 2:
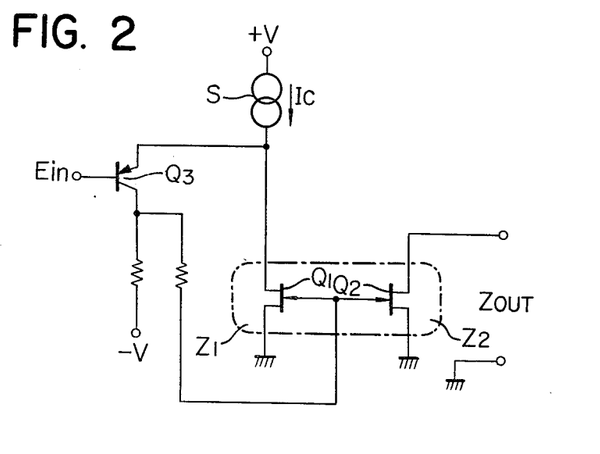
FIG. 2 is a circuit diagram of a second embodiment of the present invention having two field effect transistors and a negative feedback amplifier consisting of a transistor.
Figure 3:
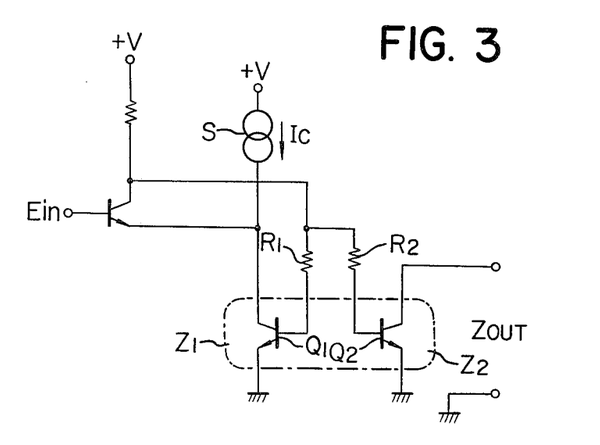
FIG. 3 is a circuit diagram of a third embodiment of the present invention.

Since the current $I_c$ is constant, it is possible to derive the output impedance $Z_{out}$ which is proportional to the input voltage $E_{in}$. Although the operational amplifier $OP_1$ was used as a negative feedback amplifier in the above first embodiment, a PNP transistor $Q_3$ and two field effect transistors are used in the second embodiment shown in FIG. 2, and an NPN transistor $Q_4$ is used in the third embodiment shown in FIG. 3, and they operate in the same manner as described above.

Figure 4:
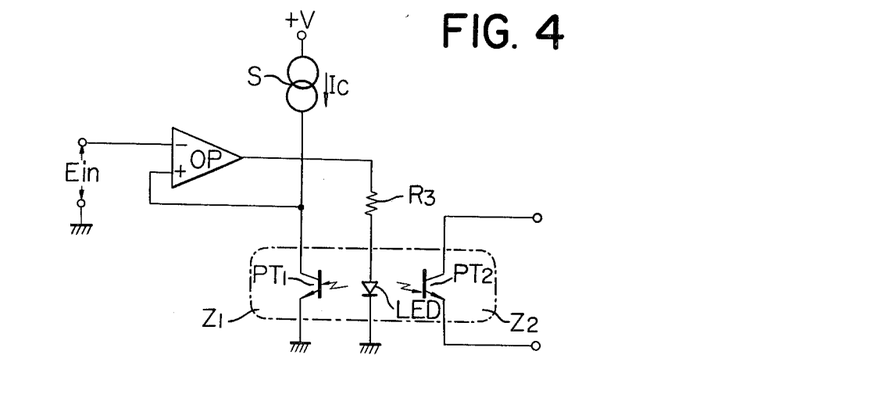
FIG. 4 is a circuit diagram of a fourth embodiment of the present invention having two phototransistors and an emitter diode.

The fourth embodiment of the present invention is shown in FIG. 4. Although transistors were used as the active elements in the embodiments shown in FIGS. 1–3, phototransistors are used as the active elements in the fourth embodiment. Thus, the output of the operational amplifier $OP_1$ is the input to a light emitting diode LED. The light emitted in accordance with the magnitude of the current flowing through the light emitting diode LED is input to the phototransistors. The operation is the same as in the case of the first through third embodiments. In the fourth embodiment, since a photocoupler is used, the blocking effects between these two phototransistors $PT_1$ and $PT_2$ are improved.

Figure 5:
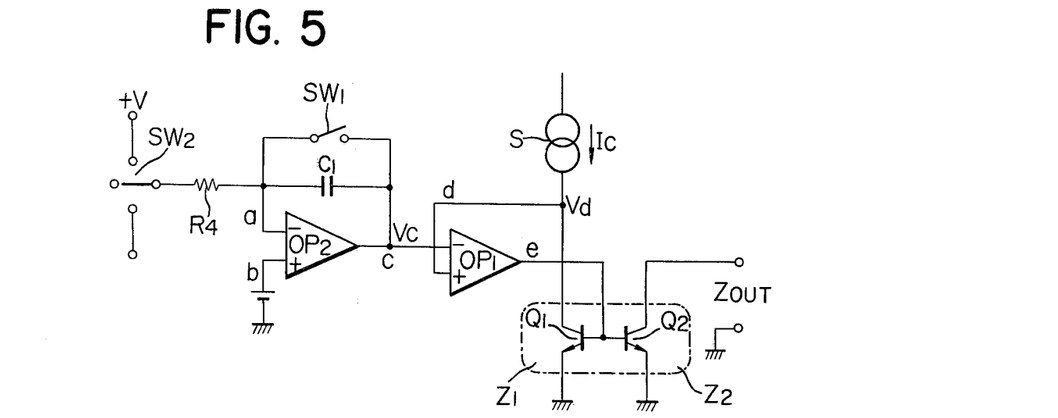
FIG. 5 is a circuit diagram of a fifth embodiment of the present invention.

The fifth embodiment is shown in FIG. 5 wherein an analog memory is connected to the input side for linearly varying the impedance. This analog memory comprises a field-effect transistor type operational amplifier $OP_2$ and a parallel circuit consisting of a switch $SW_1$ and a capacitor $C_1$ connected in parallel to the inverting input side and to the output side of the operational amplifier. A switch $SW_2$, connected through a resistor $R_4$ to a power source $+V$ or $V$ is connected to the inverting input side. The output of this operational amplifier $OP_2$ is connected to the impedance transducer, and the input leakage current of this operational amplifier is not considered.

The operation of the circuit shown in FIG. 5 will now be described, neglecting the input offset voltages of the operational amplifiers $OP_1$ and $OP_2$. When the non-inverting input E of the operational amplifier $OP_2$ is taken as 0 volts (the point b is grounded), the potential at the point c is 0 volts when the switch $SW_2$ is held at its intermediate position (open) and the switch $SW_1$ is closed. The operational amplifier $OP_1$ applies a current to the base of the transistor $Q_1$ to activate the transistor $Q_1$. The transistor $Q_1$ is activated and the potential at the point d is kept at 0 volts. The internal impedance $Z_1$ (resistance between the collector and the emitter) of the transistor $Q_1$ is given as follows:

$$Z_1 = v_d/I \qquad (3)$$

since $$v_d = 0,$$

it follows that $$Z_1 = 0\Omega$$

where I is the current supplied from the constant current source S.

A current of the same value simultaneously flows through the base of the transistor $Q_2$. The inner impedance $Z_2$ of the transistor $Q_2$ is thus also $0\Omega$.

When the switch $SW_1$ is opened and the switch $SW_2$ is closed, the current $I_R = -V/R_4$ flows from the point c to the $(-V)$ power source through the capacitor $C_1$ and the resistor $R_4$. The potential $v_c$ at the point c after the time t is given as follows:

$$v_c = -\frac{-V}{C_1 \cdot R_4} \cdot t = \frac{V}{C_1 \cdot R_4} \cdot t \qquad (4)$$

When the switch is again moved to its intermediate position (open), the current flow to the capacitor $C_1$ stops and the potential at the point c is maintained. The operational amplifier $OP_1$ acts to control, from the point e, the base current of the transistor $Q_1$ so that $v_d = v_c$. The inner impedance of the transistor $Q_1$ is given by the equation (3). It is also apparent that $Z_2 = Z_1$. That is, the impedance of the transistor $Q_2$ is equal to the impedance of the transistor $Q_1$, and they always vary together. From the above, it is obvious that it is possible to change the inner impedance $Z_1$ of the transistor $Q_1$, and therefore the impedance $Z_2$ of the transistor $Q_2$, by changing the potential $v_c$ at the point c, that is, by changing the voltage across the capacitor $C_1$.

In order to lower the impedance $Z_2$ which has been raised once, the switch $SW_2$ is closed to be connected to the power source $(+V)$. Then the current $I_R = V/R_4$ flows to the point c from the power source $(+V)$ through the resistor $R_4$ and the capacitor $C_1$, so that the electric charge at the capacitor $C_1$ is discharged. When the initial potential at the point c is $v_{c0}$, the potential at the point c after the time $t'$ is given as follows:

$$v_c = v_{c0} - \frac{V}{C_1 \cdot R_4} \cdot t' \qquad (5)$$

Thus, $v_c$ ultimately becomes 0 volts.

The above description applies when the potential at the point b is 0 volts, the operational amplifiers $OP_1$ and $OP_2$ are ideal, and there is no leakage current from the capacitor $C_1$. In practice, however, the operational amplifiers $OP_1$ and $OP_2$ are not ideal, and there is some leakage current from the capacitor $C_1$. Thus, when the capacitor $C_1$ is charged to maintain the impedance $Z_2$, the potential $v_c$ at the point c is decreased after a long period of time, and the impedance $Z_2$ at the output terminal gradually decreases. In other words, when the capacitor $C_1$ is discharged and the potential at each terminal of the operational amplifier $OP_1$ is equal to the potential $v_b$, the impedance $Z_2$ is stabilized. If a biasing voltage E is connected to the point b, the potential at each terminal of the operational amplifier $OP_2$ is E, that is, the potential at the point c is E, so that an impedance of corresponding magnitude can be obtained in an extremely stable manner.

Accordingly, increasing or decreasing the impedance $Z_2$ when the biasing voltage E is applied to the point b can be performed in the manner described above. That is, the potential $v_c$ at the point c is given as follows:

$$v_c = E \pm \frac{V}{CR} \cdot t \qquad (6)$$

Figure 6:
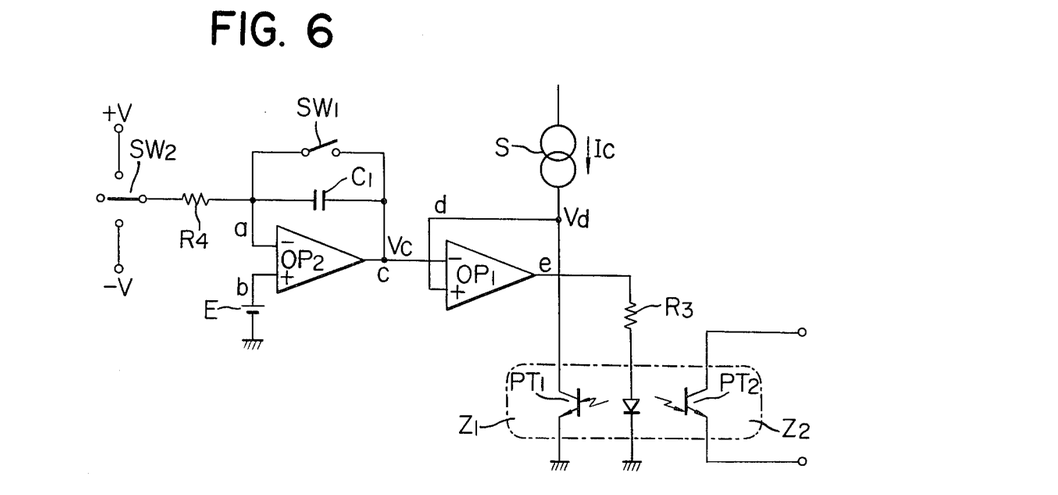
FIG. 6 is a circuit diagram of a modified example of the fifth embodiment.

FIG. 6 shows modified example of the fifth embodiment shown in FIG. 5; the output of the operational amplifier $OP_1$ is applied to a light emitting diode LED, and two phototransistors $PT_1$ and $PT_2$ are used instead of the two transistors. The operation is the same as in the case of the fifth embodiment.

Figure 7:
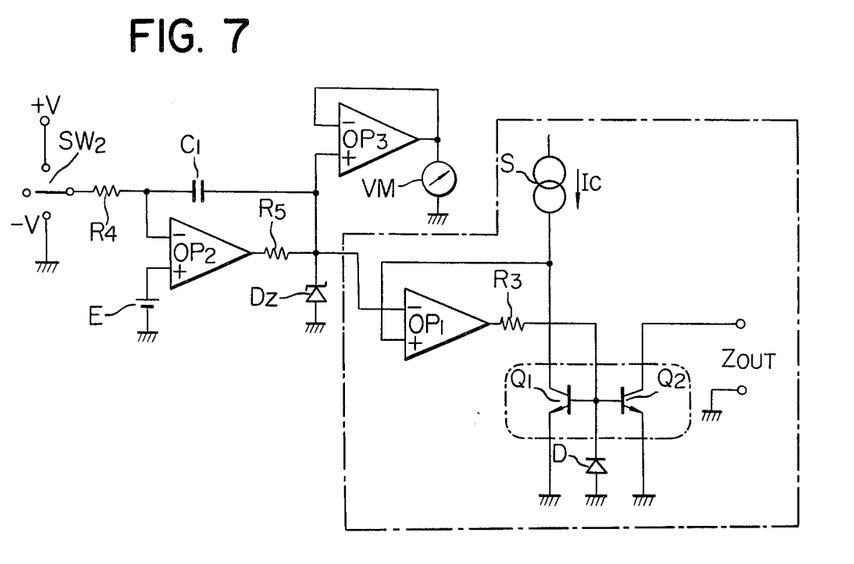
FIG. 7 is a circuit diagram of a further example of the fifth embodiment.

In the procedure as described above, there are cases when the operator will want to confirm the magnitude of the impedance $Z_2$. This may be accomplished by observing the voltage at the point c or the point d, as shown in FIG. 7. The switch $SW_1$ shown in FIG. 5 was included for ease of explanation, and this may actually be eliminated if the operation range at the point c is regulated. In FIG. 7, $OP_3$ is an operational amplifier and VM is a voltage meter. The symbol $D_z$ signifies a Zener diode for regulating the range of the voltage at the point c (e.g., from 0 volts to the Zener voltage of the Zener diode $D_z$). A diode D is included to prevent the flow of excessive current through the transistors $Q_1$ and $Q_2$. The symbol $R_5$ signifies a current limiting resistor for the Zener diode $D_z$. The Zener voltage $V_z$ of the Zener diode $D_z$ is kept slightly greater than the operating range of the potential $V_d$ at the point d.

Figure 8:
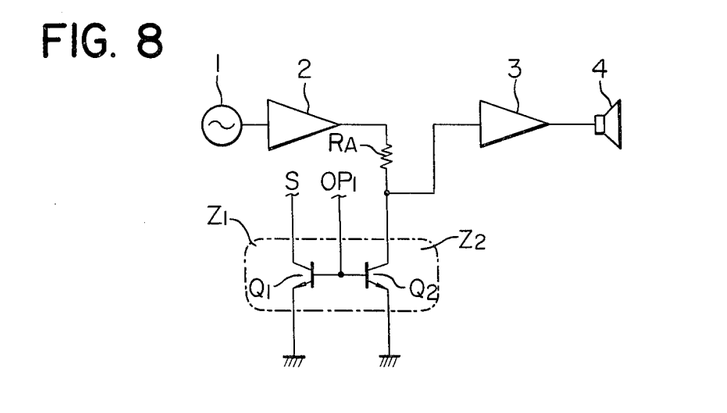
FIGS. 8, 9, 10 and 11 are circuit diagrams of a further example of the fifth embodiment.

FIG. 8 shows an example of an impedance transducer used in a volume adjusting device. In FIG. 8, numeral 1 denotes an audio signal input; 2, a preamplifier; 3, a main amplifier; 4, a speaker; and $R_A$ is a voltage dividing resistor. The input of the main amplifier 3 is determined by the ratio of the resistance $R_A$ to the impedance $Z_2$ and by the output of the preamplifier 2. This input increases as the impedance $Z_2$ increases. In this case, assume that the impedance $Z_2$ ($Z_{out}$) for outputting a reference volume level (or reference input level of the main amplifier) is $Z_f$. Then, $$Z_f = E/I \qquad (7)$$

that is, when the capacitor C is substantially discharged, the impedance $Z_2$ is stabilized and the volume of sound from the speaker is also stabilized.

Figure 9:
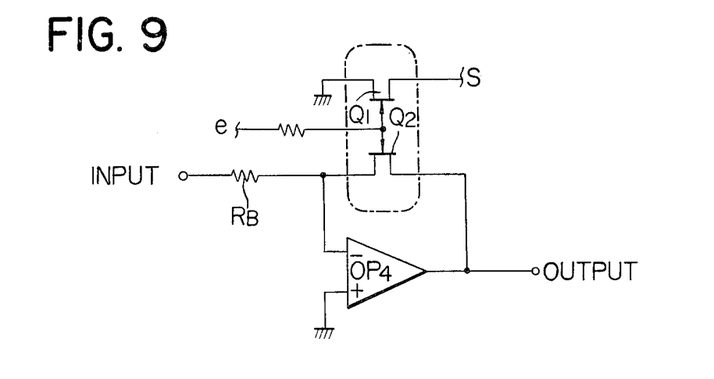

FIG. 9 shows an example of a gain control for an operational amplifier in accordance with the present invention. The symbols $Q_1$ and $Q_2$ shown in FIG. 9 represent field-effect transistors which correspond to the transistors $Q_1$ and $Q_2$ shown in FIG. 5. However, their input resistances are considerably greater than in the case of transistors; hence, they are stable. In FIG. 9, the internal impedance of the field-effect transistor $Q_2$ varies according to changes in the input from the points d and e. The ratio of this internal impedance to the resistance $R_B$ also changes, thus varying the amplifying ratio of the operational amplifier $OP_4$.

Figure 10:
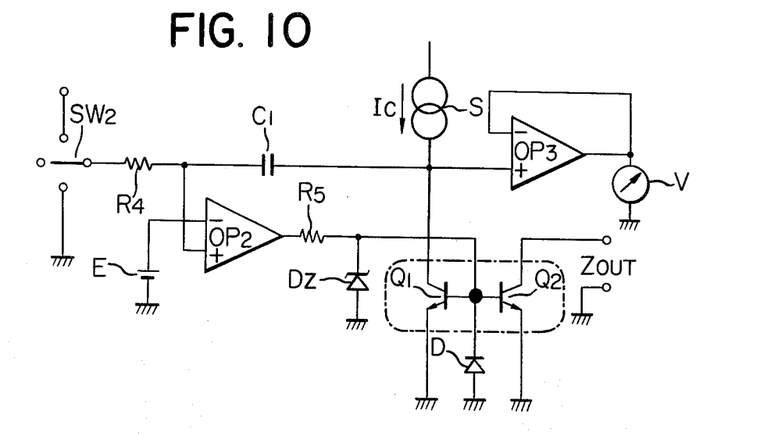

FIG. 10 shows a schematic circuit diagram which is equivalent to the one shown in FIG. 7 without the operational amplifier $OP_1$. In this case, however, the inverting and non-inverting inputs of the operational amplifier $OP_2$ must be inverted as compared to the one shown in FIG. 7.

Figures 11, 12:
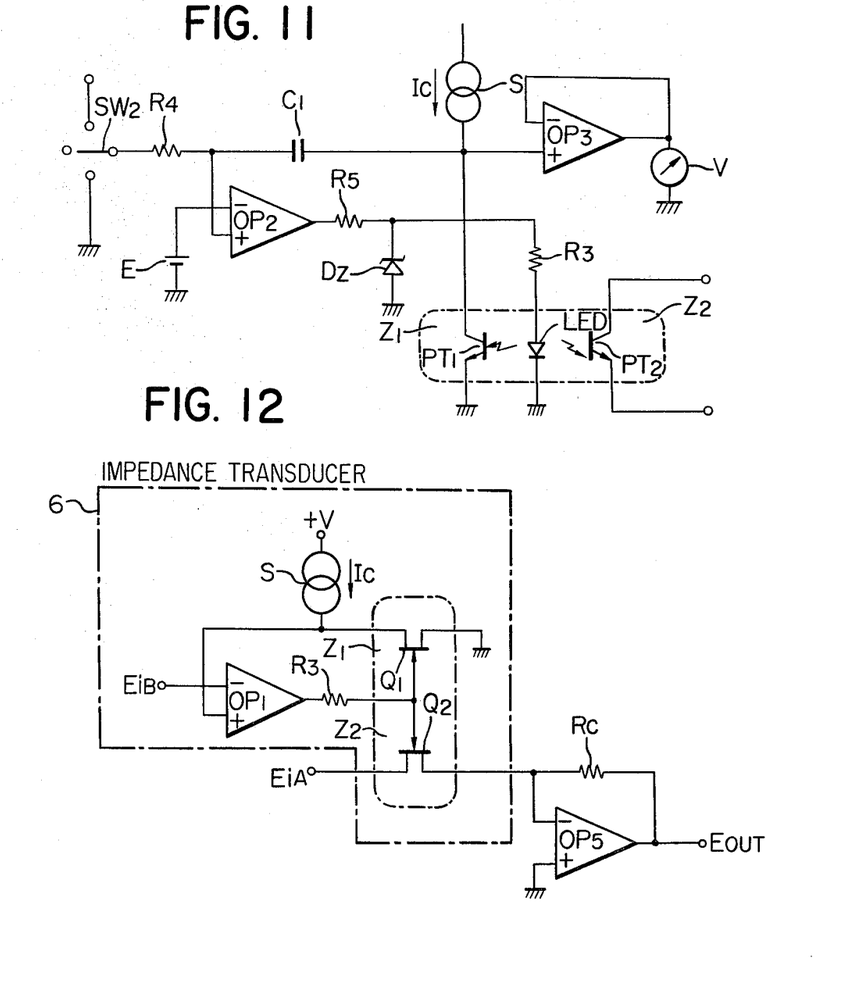
FIGS. 12 and 13 are circuit diagrams of dividers using an impedance transducer according to the present invention.

FIG. 11 shows a modified example of the example of FIG. 10, which comprises a light emitting diode LED and two phototransistors $PT_1$ and $PT_2$ instead of the transistors $Q_1$ and $Q_2$.

FIG. 12 shows a further example of the present invention. The circuit shown within the alternate long and short dash line 6 is the impedance transducer shown in FIG. 1. Symbols $Q_1$ and $Q_2$ represent field-effect transistors which are formed close to each other on the same pellet with substantially the same characteristics and substantially the same mutual conductance. The field-effect transistors $Q_1$ and $Q_2$ are both grounded at their sources ($Q_2$ is ideally grounded). Their gates are mutually connected and are connected with the output terminal of the operational amplifier $OP_1$ through the resistor $R_3$. The drain of the field-effect transistor $Q_1$ is connected to the constant current source S as well as to the non-inverting input of the operational amplifier $OP_1$. The operational amplifier $OP_1$, the field-effect transistor $Q_1$, and the resistor $R_3$ comprise a negative feedback amplifier.

Accordingly, the next equation may be satisfied:

$$Z_2 = E_{iB}/I_c \qquad (8)$$

An operational amplifier $OP_5$, the internal impedance $Z_2$ of the field-effect transistor $Q_2$ and a resistor $R_c$ comprise a general inverting amplifier. Thus, the next equation between the input voltage $E_{iA}$ and the output voltage $E_{out}$ is obtained.

$$E_{out} = -\frac{R_0}{Z_2} E_{iA} \qquad (9)$$

Thus, from the equations (8) and (9), $$E_{out} = -R_0 I_c \frac{E_{iA}}{E_{iB}} = k_1 \frac{E_{iA}}{E_{iB}} \qquad (10)$$

where $k_1 = -R_0 I_c$, and the operational ranges of the input voltages $E_{iA}$ and $E_{iB}$ are $$0 \leq E_{iA} \leq (+)V$$

$$0 \leq E_{iB} \leq (+)V$$

This describes a divider utilizing the voltage and impedance transducer of the present invention.

Figure 13:
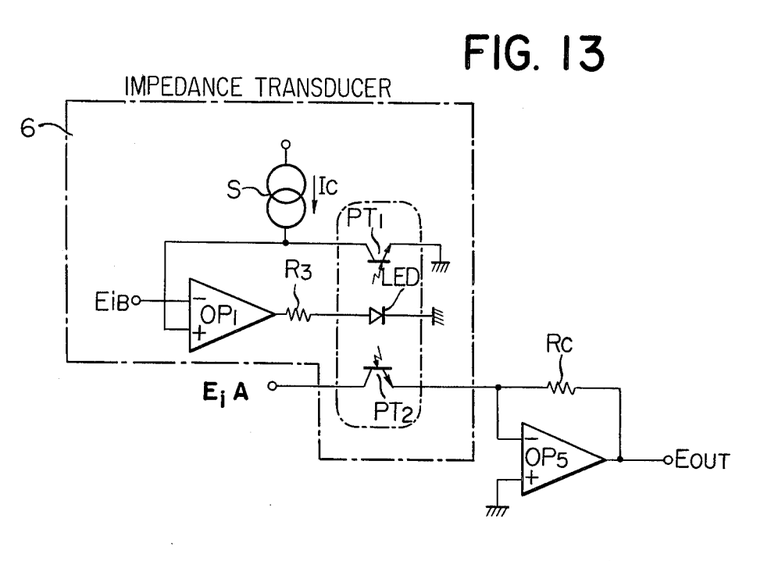

FIG. 13 shows a modified divider of the example of FIG. 12, which comprises a light emitting diode LED and two phototransistors $PT_1$ and $PT_2$.

Figure 14:
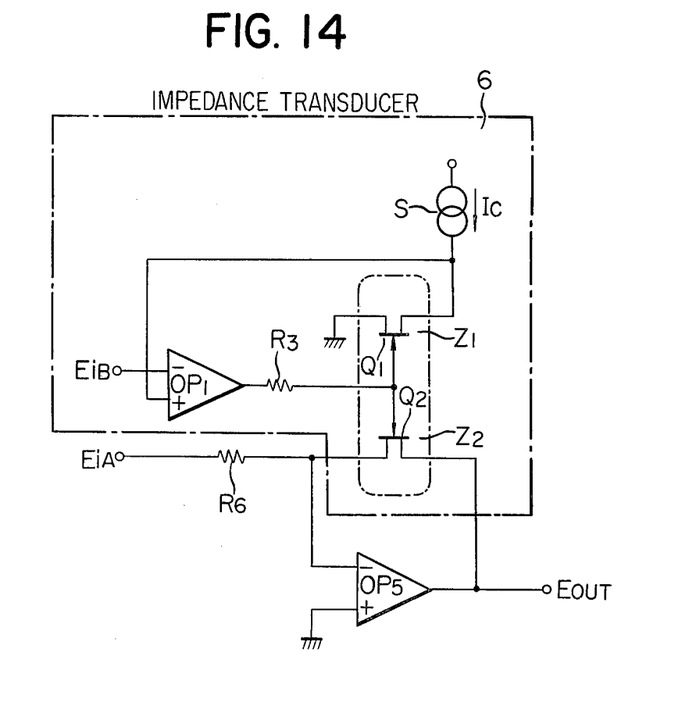
FIGS. 14 and 15 are circuit diagrams of multipliers using an impedance transducer according to the present invention.

FIG. 14 shows another example of the present invention. The circuit shown within the alternate long and short dash line 6 is the same as the circuit shown within the alternate long and short dash line 6 of FIG. 12. Thus, the equation (8) can also be satisfied in this case. The operational amplifier $OP_5$, the internal impedance $Z_2$ of the field-effect transistor $Q_2$, and the resistor $R_i$ comprise a general inverting amplifier. Thus, the following relations hold between the input voltage $E_{iA}$ and the output voltage $E_{out}$:

$$E_{out} = -\frac{Z_2}{R_i} E_{iA} \qquad (11)$$

Thus from the equations (8) and (11), $$E_{out} = -\frac{1}{R_i I_c} E_{iA} \cdot E_{iB} \qquad (12)$$

$$= k_2 \cdot E_{iA} \cdot E_{iB}$$

where $k_2 = -(1/R_i I_c)$ and the operating ranges of the input voltages $E_{iA}$ and $E_{iB}$ are $$0 \leq E_{iA} \leq ()V$$

$$0 \leq E_{iB} \leq (+)V$$

This describes a multiplier utilizing the voltage impedance transducer of the present invention.

Figure 15:
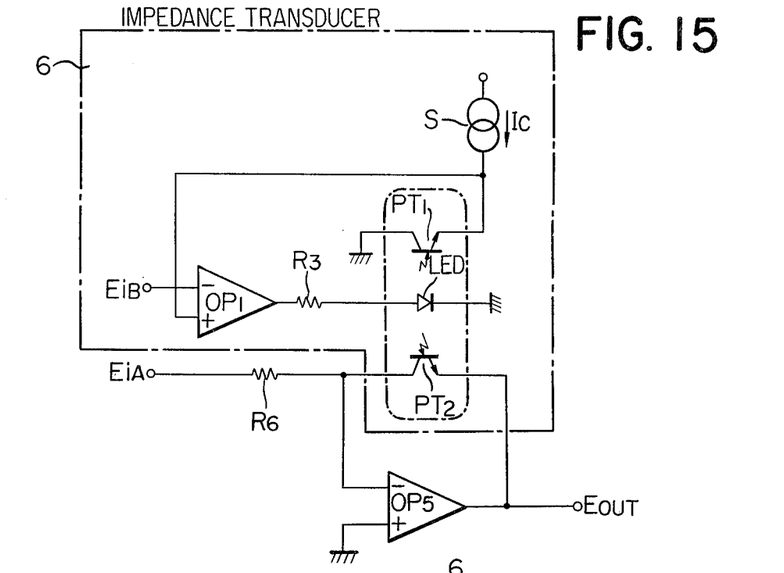

FIG. 15 shows a modified multiplier of the example of FIG. 14, which comprises a light emitting diode LED and two phototransistors $PT_1$ and $PT_2$.

Figure 16:
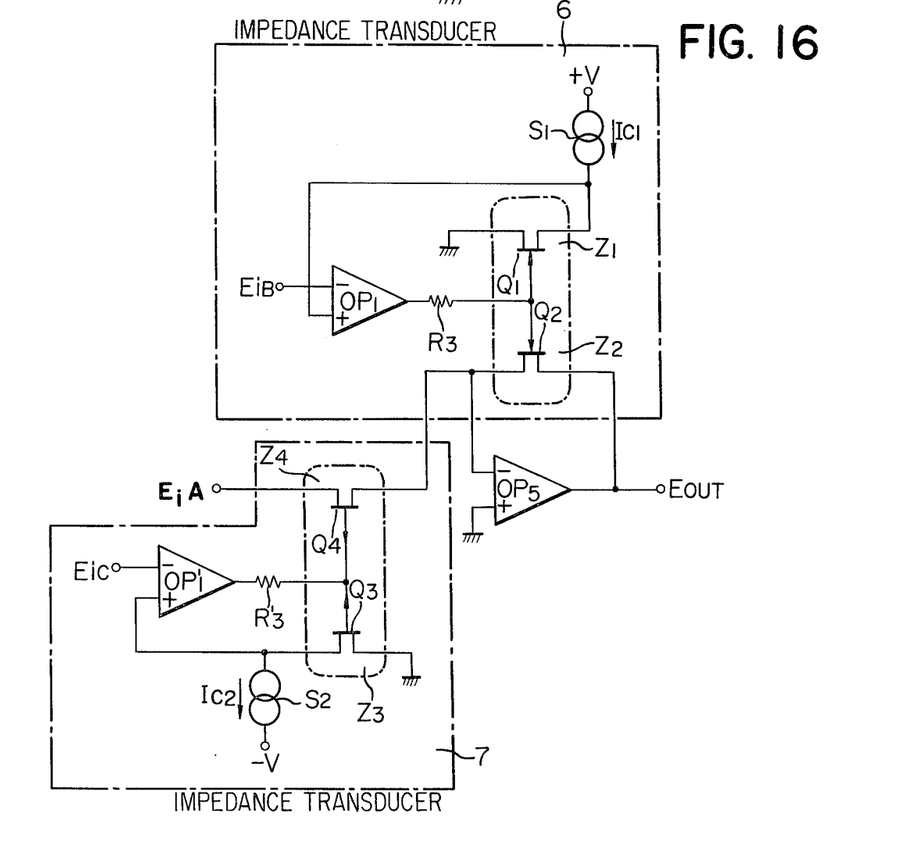
FIGS. 16 and 17 are circuit diagrams of a multiplying divider using an impedance transducer according to the present invention.

FIG. 16 shows still another example of the present invention. The circuit within the alternate long and short dash lines 6 and the circuit within the alternate long and short dash line 7 are both impedance transducers according to the present invention. The operational amplifier $OP_5$, the internal impedance $Z_2$ of the field-effect transistor $Q_2$, and the internal impedance $Z_4$ of the field-effect transistor $Q_4$ comprise an inverting amplifier. Since $$E_{out} = -\frac{Z_2}{Z_4} E_{iA} \qquad (13)$$

it follows that $$E_{out} = k_3 \frac{E_{iA} \cdot E_{iB}}{E_{ic}} \qquad (14)$$

where $K_3 = -(I_{c2}/I_{c1})$ and the operating ranges of the input voltage $E_{iA}$, $E_{iB}$ and $E_{ic}$ are $$0 \leq E_{iA} \leq (-)V$$

$$0 \leq E_{iB} \leq (+)V$$

$$0 \leq E_{iC} \leq (-)V$$

This describes a multiplying divider utilizing the voltage impedance transducer of the present invention.

Figure 17:
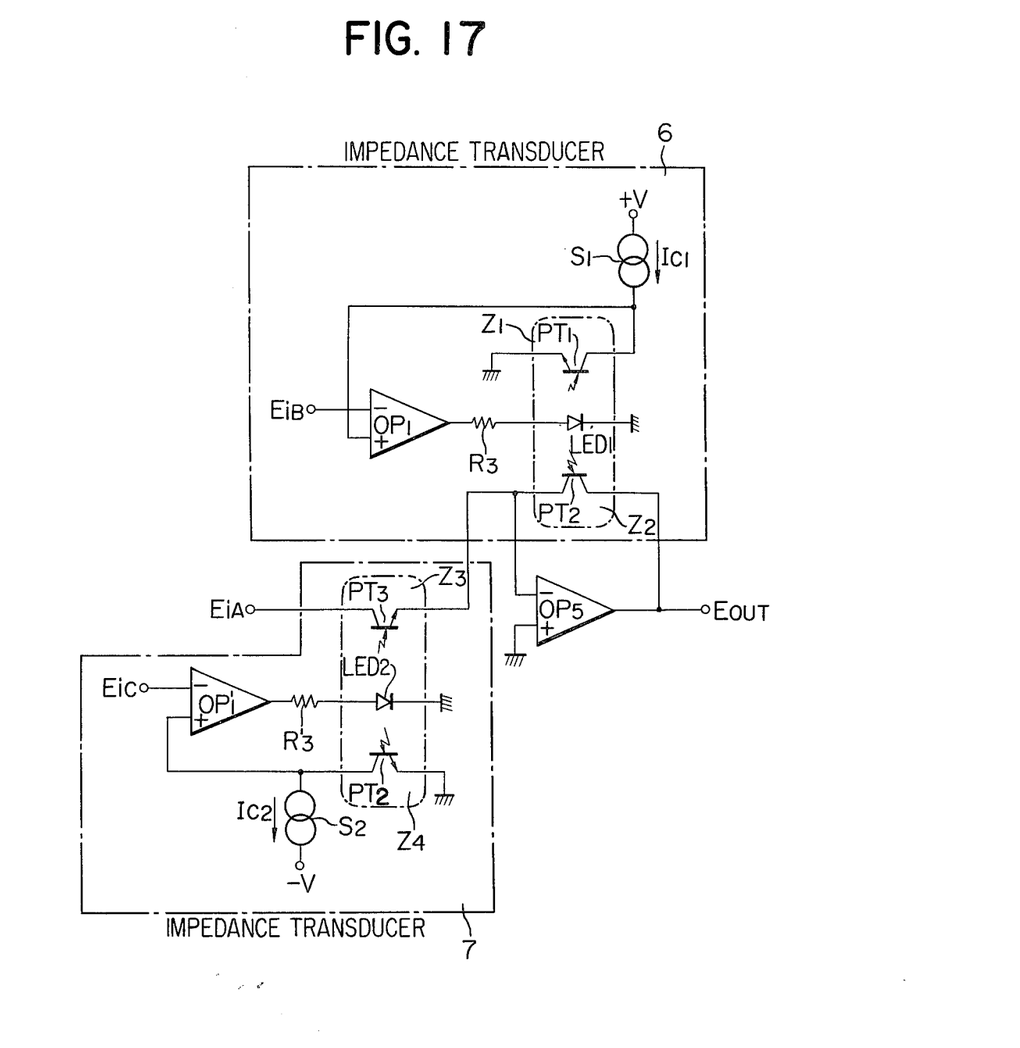

FIG. 17 shows a modified multiplying divider of the example of FIG. 16, which comprises two light emitting diodes $LED_1$ and $LED_2$ and four phototransistors $PT_1$, $PT_2$, $PT_3$ and $PT_4$.

Figure 18:
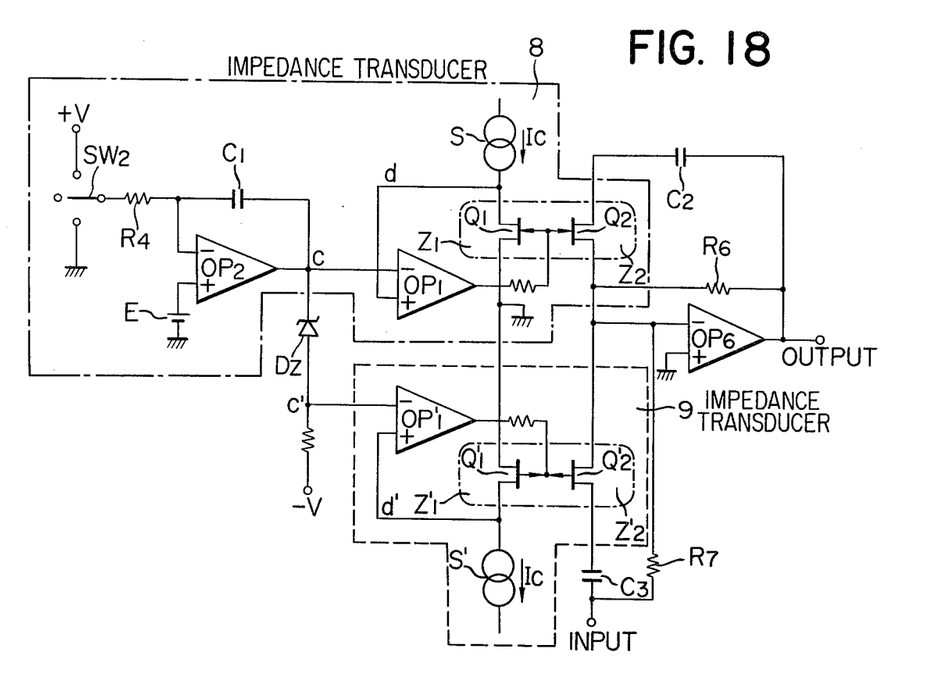
FIGS. 18 and 19 are circuit diagrams of a sixth embodiment of the impedance transducer of the present invention.

FIG. 18 shows a sixth embodiment of the present invention. The circuit shown within the alternate long and short dash line 8 is the same as the circuit shown in FIG. 5, and the circuit within the line frame 9 is the same as the circuit shown in FIG. 1. The active elements $Q_1'$ and $Q_2'$, in this case, have reverse polarity as compared to the elements $Q_1$ and $Q_2$. The constant current source S' also has a reverse polarity as compared to that of the constant current source S. The inverting input terminals of the operational amplifiers $OP_1$ and $OP_1'$ are connected to each other through a constant voltage source. As may be seen from the description referring to FIG. 5, the internal impedance $Z_2$ of the active element $Q_2$ is proportional to the potential at the point c, and the internal impedance $Z_2'$ of the active element $Q_2'$ is proportional to the potential at the point c'. The sum of both impedances, $Z_2$ and $Z_2'$, is proportional to the voltage $V_{DZ}$ of the constant voltage source $D_Z$ and is constant.

Figure 20:
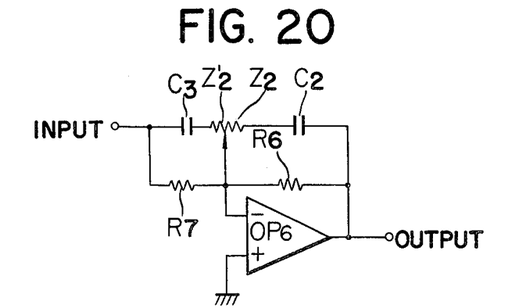
FIG. 20 is an equivalent circuit diagram of the output circuit of FIGS. 18 and 19.
Figure 21:
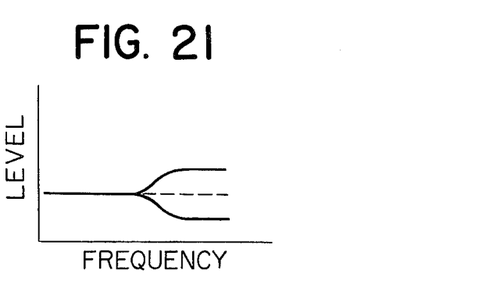
FIG. 21 is a view showing the adjustment range of the impedance in these embodiments.

In the circuit shown in FIG. 18, the capacitors $C_2$ and $C_3$ are connected in series to the output circuits at the output side of the active elements $Q_2$ and $Q_2$, respectively. The circuit of this figure is constructed for high frequency adjustment. The equivalent circuit of the output part of this circuit is as shown in FIG. 20, and its adjusting range is shown in FIG. 21.

Figure 19:
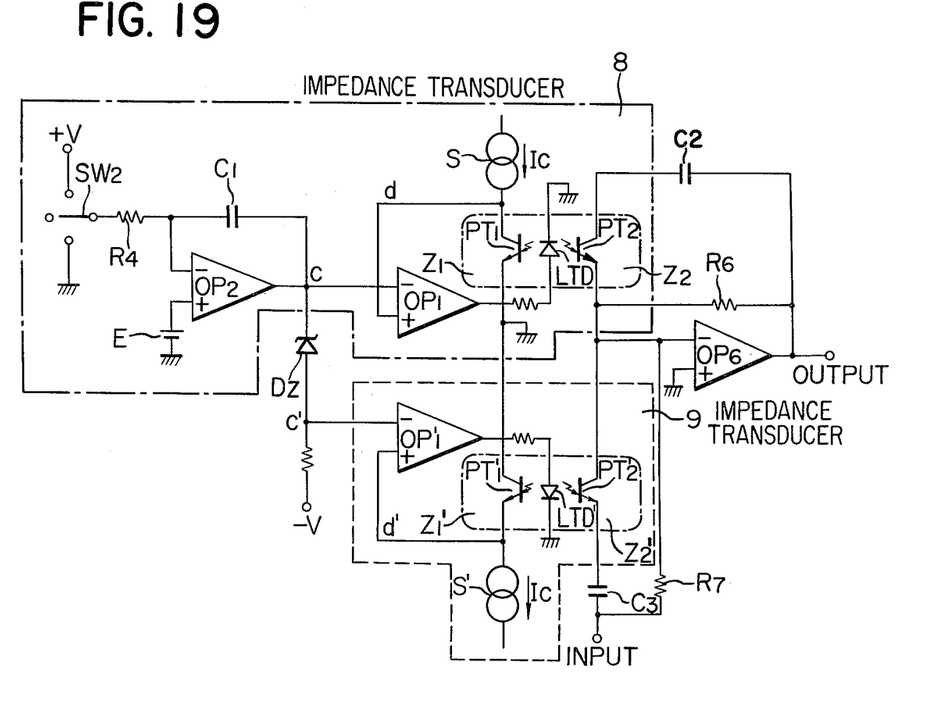

FIG. 19 shows a modified example of the example of FIG. 16 which comprises two light emitting diodes $LED_1$ and $LED_1'$ and four phototransistors $PT_1$, $PT_2$, $PT_1'$ and $PT_2'$.

Figure 22:
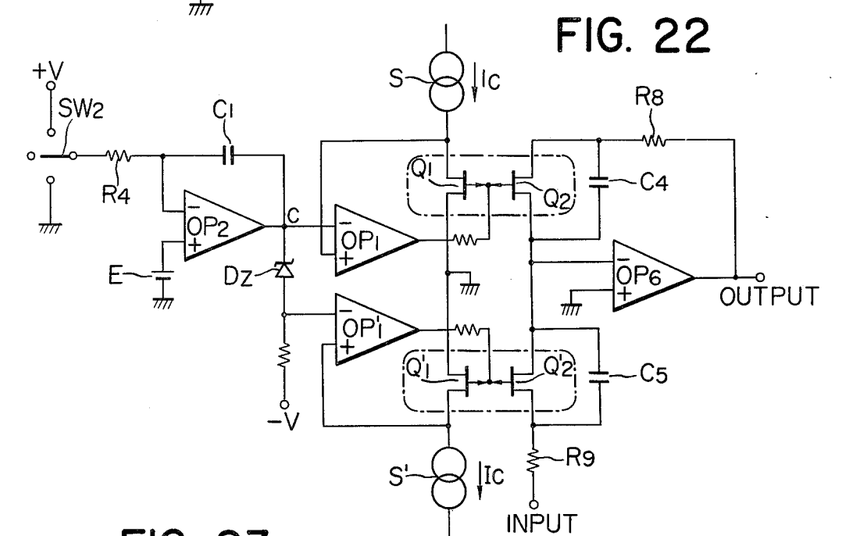
FIGS. 22 and 23 are circuit diagrams of a seventh embodiment of the present invention.

FIG. 22 shows a seventh embodiment of the present invention for low frequency adjustment. The capacitors $C_4$ and $C_5$ are connected in parallel to the output side of the active elements $Q_2$ and $Q_2'$, respectively. The equivalent circuit of the output part of this circuit is shown in FIG. 24, and the range of adjustment is shown in FIG. 25.

Figure 23:
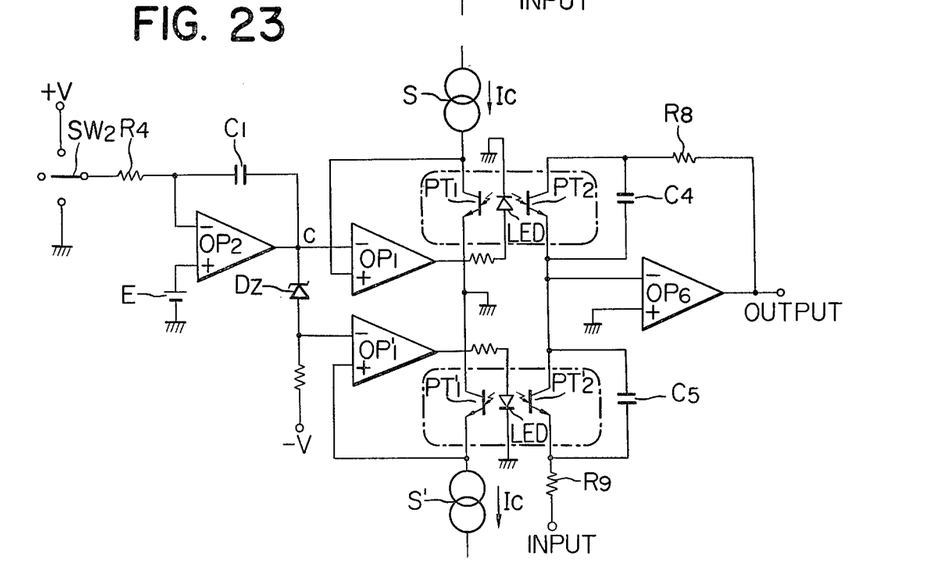

FIG. 23 shows a modified example of the seventh embodiment, which comprises two light emitting diodes $LED_1$ and $LED_1'$ and four phototransistors $PT_1$, $PT_2$, $PT_1'$ and $PT_2'$.

Figures 24, 25, 26:
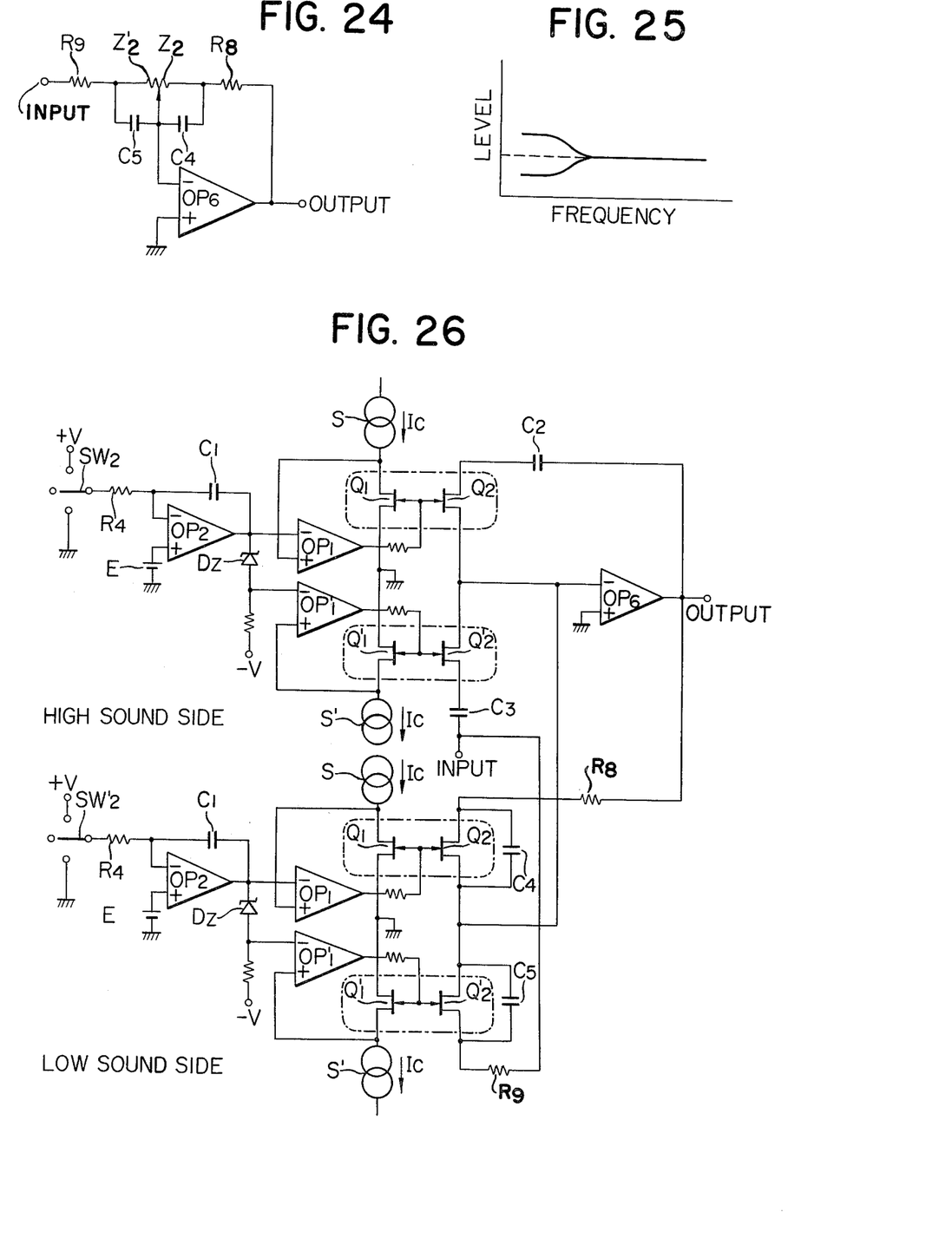
FIG. 24 is an equivalent circuit diagram of the output part of FIGS. 22 and 23.
FIG. 25 is a view showing the adjustment range of the impedance in this embodiment.
FIGS. 26 and 27 are circuit diagrams of sound quality adjusting impedance transducer circuits in accordance with the present invention for use in an audio circuit.
Figure 28:
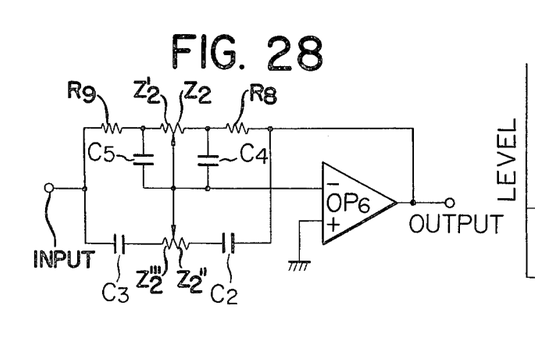
FIG. 28 is an equivalent circuit of the output part.
Figure 29:
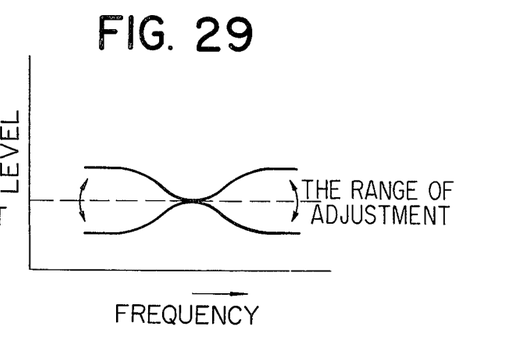
FIG. 29 is a view showing the adjustment range of the impedance at the output of the circuits shown in FIGS. 26 and 27.

FIG. 26 shows a volume adjusting impedance transducer circuit of an audio circuit which is a combination of the circuits shown in FIGS. 18 and 23. The equivalent circuit of the output part of this circuit is shown in FIG. 28, and the range of adjustment is shown in FIG. 29.

Figure 27:
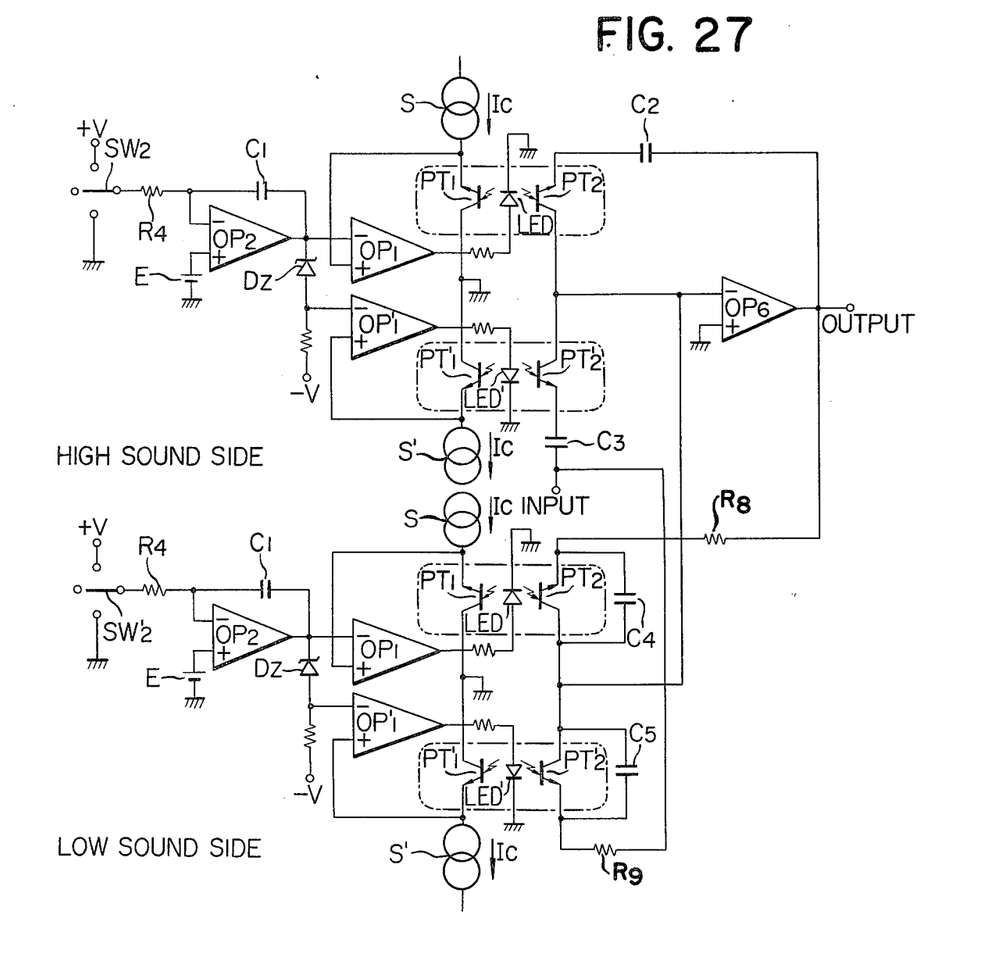

FIG. 27 shows a modified example of the example shown in FIG. 26, which comprises four light emitting diodes and eight phototransistors.

Figure 30:
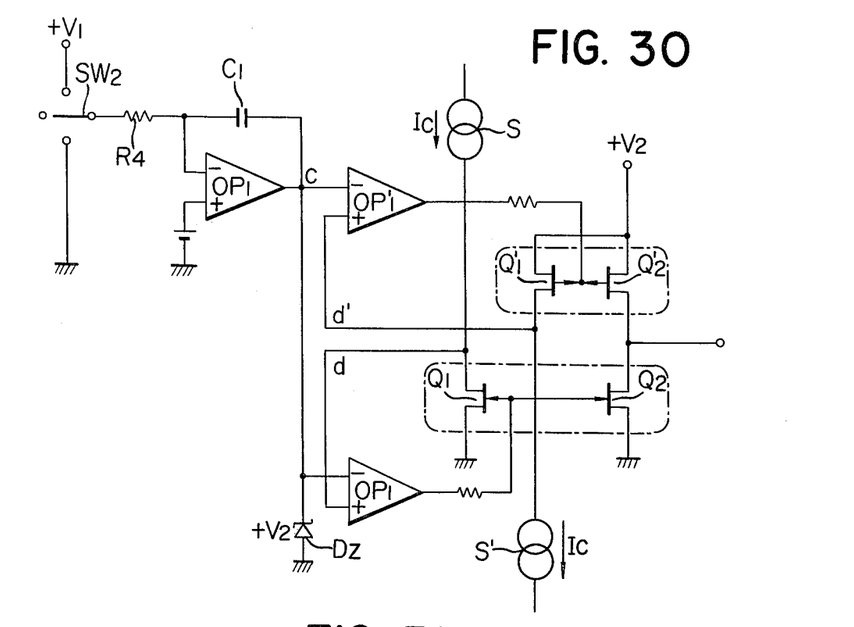
FIGS. 30 and 31 are circuit diagrams of an eighth embodiment of the present invention.
Figures 31, 32:
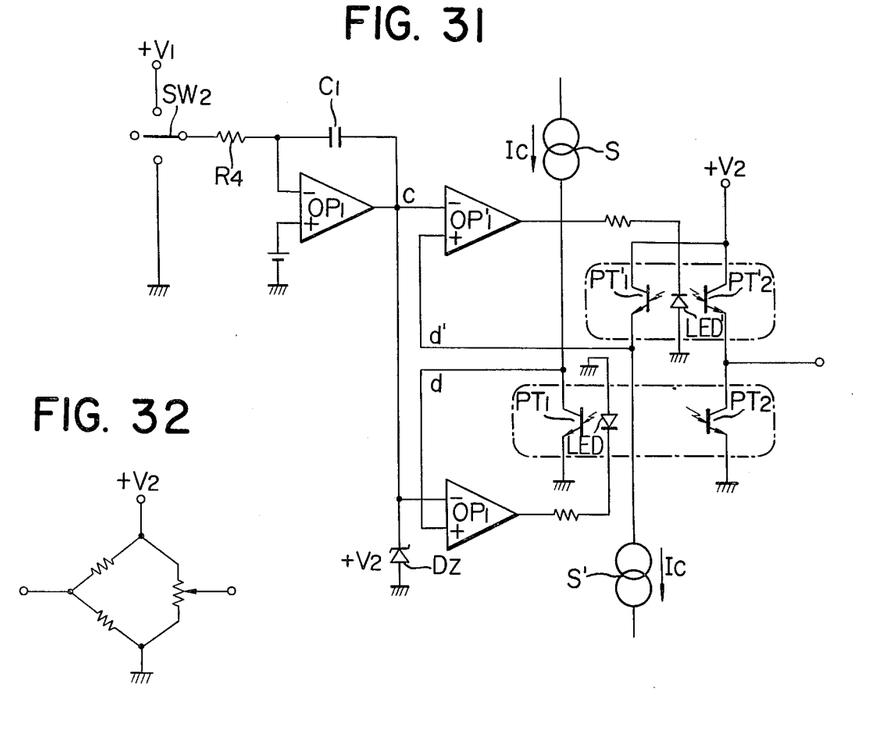
FIG. 32 is an equivalent circuit diagram of FIGS. 30 and 31.

FIG. 30 shows an eighth embodiment of the present invention. A constant power source is connected to the output terminal of an integrator, that is, between the inverting input terminals of each of the negative feedback amplifiers and ground. The output circuits of the active elements for negative feedback are not connected in series, and the source of the output side active element is connected to a positive power source. When the potential at the point c varies, the internal impedance of the active element $Q_2'$ decreases as the internal impedance of the active element $Q_2$ increases. Since the voltage applied to both active elements is $V_2$, its equivalent circuit is as shown in FIG. 32. This can conveniently be used for adjusting a bridge.

FIG. 31 shows a modified example of the example of FIG. 30, which comprises two light emitting diodes LED and LED' and four phototransistors $PT_1$, $PT_2$, $PT_1'$ and $PT_2'$.

In summary, in accordance with the present invention, the transistors $Q_1$ and $Q_2$ and the field-effect transistors $FET_1$ and $FET_2$ are formed on the same pellet so that they can be kept under the condition of the same temperature. Thus, their characteristics can always be kept the same. Therefore, the internal impedance of one of the transistors or field-effect transistors can be taken as the internal impedance of the other. Since the circuit is simple in construction, and can be controlled electronically without involving any mechanical structures, and since the change in the output impedance $Z_{out}$ can be controlled linearly, a conventional circuit which is complex in construction does not have to be used and mechanical troubles or noise rarely occur. Thus, the present invention is able to provide a variable resistor with these features which can obtain an impedance proportional to the difference between a constant potential and the output potential, that is, a certain potential of an integrator. It is also able to provide a variable resistor which can obtain an impedance proportional to a potential derived by subtracting the output potential, that is, a certain potential of an integrator, from a certain voltage.

What is claimed is:

1. A variable impedance circuit, comprising:
   first and second transistors mounted on a common thermally conductive substrate so that said transistors remain at substantially the same temperature, each transistor having two main electrodes and a control electrode means, said transistors exhibiting essentially the same electrical characteristics at said electrodes;
   a negative feedback amplifier having an input terminal and connected in circuit with said first transistor to vary the impedance between the main electrode means of said first transistor in a predetermined manner in accordance with an impedance control signal applied to said input terminal;
   a memory circuit coupled to said input terminal of said negative feedback amplifier for setting said impedance control signal at a desired value; and
   means for maintaining essentially the same electrical condition at each of said control electrode means, so that the impedance presented between the main electrodes of the second transistor is essentially equal to the impedance between the main electrodes of said first transistor.

2. A variable impedance circuit as claimed in claim 1 wherein said transistors are phototransistors, further comprising a common light emitting diode for optically driving the control electrode means of both said phototransistors.

3. A variable impedance circuit as claimed in claim 1 wherein said two active elements comprise field-effect transistors.

4. A variable impedance circuit as claimed in claim 1 wherein said negative feedback amplifier comprises at least one operational amplifier.

5. A variable impedance circuit as claimed in claim 1 wherein said negative feedback amplifier comprises transistors.

6. A variable impedance circuit as claimed in claim 1 wherein said memory circuit comprises a capacitor and a switch connected in parallel between the inverting input terminal and the output terminal of an operational amplifier, and a switch for connecting said inverting input terminal to a negative or positive power source.

7. A variable impedance circuit as claimed in claim 1, further comprising a voltage meter for detecting the impedance of said active element at the output side, said voltage meter being connected through an operational amplifier to a junction point of the input terminal of said negative feedback amplifier and an output terminal of said memory circuit.

8. The impedance circuit according to claim 1, further comprising a constant current source connected in series with the main electrodes of said first transistor.

9. An impedance transducer comprising a first group of two field-effect transistors which are formed on one thermally conductive base plate and whose gates are connected to each other; a second group of field-effect transistors which are formed on a thermally conductive base plate and whose polarity is opposite that of the first group and which are similarly connected; two operational amplifiers whose outputs are respectively input to the gates of said field-effect transistors; and a memory circuit comprising an integrator which comprises a capacitor and a high input impedance operational amplifier and whose output is input to each of said operational amplifiers; wherein each of said transistor groups is used for providing a negative feedback amplification for the corresponding one of said two operational amplifiers; means for causing a constant current to flow through the output circuit of one of the transistors of each group for negative feedback amplification, so that an impedance proportional to the potential of the input from said integrator to each of said two operational amplifiers is presented as the internal impedance of the other transistor of each group.

10. An impedance transducer as claimed in claim 9, further comprising a constant voltage source inserted between the input terminals of each of said two operational amplifiers connected to said integrator, wherein the output circuits of said one transistor of each of the negative feedback transistor groups are connected in series, their junction point is grounded, the output circuits of the other transistors of each of said groups are connected in series, so that an impedance proportional to the difference between the output potential of the integrator and a constant potential is presented across one of said output circuits of said other transistors of one of said groups.

11. An impedance transducer as claimed in claim 9, further comprising a constant voltage source inserted between the input terminals of each of said two operational amplifiers and ground; means for causing a constant current to flow separately through the output circuits of the negative feedback transistor groups; one terminal of the output circuit of each of said negative feedback transistor groups being connected to a power source of a certain voltage, so that an impedance is presented proportional to the potential derived by subtracting the potential at the output terminal of the integrator from the voltage of said power source.

* * * * *